United States Patent
Sato et al.

[11] Patent Number: 5,864,088
[45] Date of Patent: Jan. 26, 1999

[54] ELECTRONIC DEVICE HAVING THE ELECTROMAGNETIC INTERFERENCE SUPPRESSING BODY

[75] Inventors: Mitsuharu Sato; Shigeyoshi Yoshida; Tadakuni Sato; Toshihisa Inabe; Hitoshi Togawa, all of Miyagi, Japan

[73] Assignee: Tokin Corporation, Sendai, Japan

[21] Appl. No.: 374,825

[22] Filed: Jan. 19, 1995

[30] Foreign Application Priority Data

Jun. 27, 1994 [JP] Japan ...................... 6-144965
Aug. 16, 1994 [JP] Japan ...................... 6-192399

[51] Int. Cl.⁶ .................................... H05K 9/00
[52] U.S. Cl. .................... 174/35 MS; 361/816; 361/782; 257/642; 257/645; 257/724
[58] Field of Search ............. 174/35 R, 35 MS; 361/816, 818, 782; 428/255, 256, 338, 339, 692, 928; 257/642, 645, 724

[56] References Cited

U.S. PATENT DOCUMENTS

| | | | |
|---|---|---|---|
| 4,783,711 | 11/1988 | Kitada et al. | 360/113 |
| 4,890,083 | 12/1989 | Trenkler | 335/301 |
| 4,959,752 | 9/1990 | Samarov | 361/816 |
| 5,207,841 | 5/1993 | Shigeta et al. | 148/307 |
| 5,266,748 | 11/1993 | Kawakami et al. | 174/262 |
| 5,286,318 | 2/1994 | Sims et al. | 156/71 |
| 5,296,859 | 3/1994 | Naito et al. | 342/1 |

FOREIGN PATENT DOCUMENTS

| | | |
|---|---|---|
| 0090432 | 10/1983 | European Pat. Off. . |
| 0302811 | 2/1989 | European Pat. Off. . |
| 0398672 | 11/1990 | European Pat. Off. . |
| 0550373 | 10/1993 | European Pat. Off. . |
| 31 33 441 | 3/1983 | Germany . |
| 64-2399 | 1/1989 | Japan . |

*Primary Examiner*—Bot L. Ledynh
*Assistant Examiner*—Hung V. Ngo
*Attorney, Agent, or Firm*—Hopgood, Calimafde, Kalil & Judlowe

[57] ABSTRACT

An electromagnetic interference suppressing body is provided for suppressing electromagnetic interference by undesirable electromagnetic waves. The body can have a conductive support element and a non-conductive soft magnetic layer provided on at least one surface. The electromagnetic interference suppressing body may be used in circuit board electronic equipment and in a hybrid integrated circuit element having an active element and a passive element mounted on a circuit board.

3 Claims, 11 Drawing Sheets

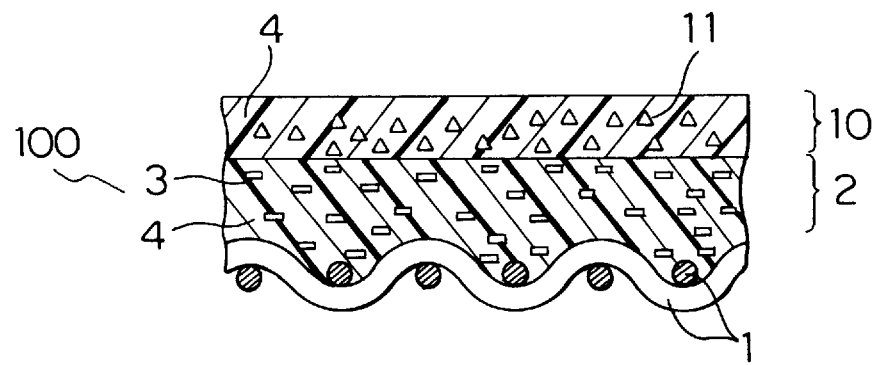
F I G. 5
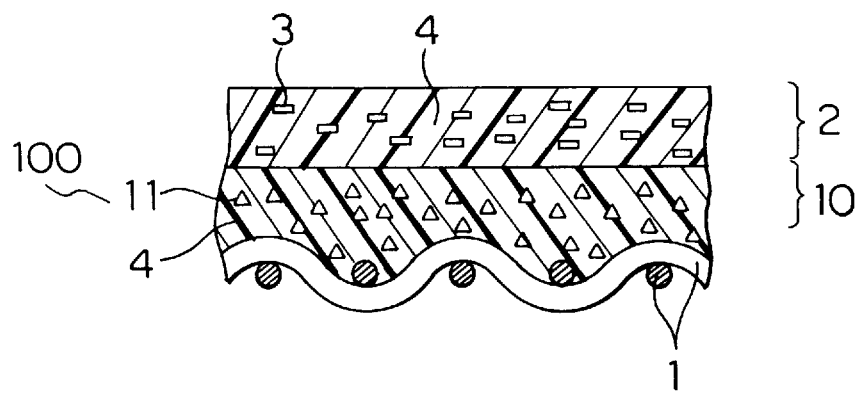
F I G. 6
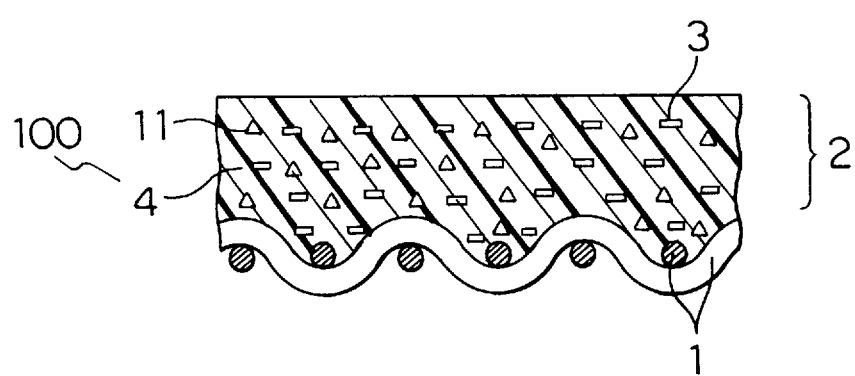
F I G. 7

| SAMPLES | TRANSPARENT LEVEL (dB) | | | | | | COUPLING LEVEL (dB) | | | | | |
|---|---|---|---|---|---|---|---|---|---|---|---|---|
| | -50 | -40 | -30 | -20 | -10 | 0 | -15 | -10 | -5 | 0 | +5 | +10 |
| 1st COMPARISON SAMPLE | ▨▨▨▨▨▨▨▨▨▨ | | | | | | | | | | ▨▨ | |
| 2nd COMPARISON SAMPLE | | | | | | ▨ | | | ▨ | | | |
| 1st SAMPLE | | | | ▨▨▨ | | | | | ▨ | | | |
| 2nd SAMPLE | | | | ▨▨▨ | | | | | ▨▨ | | | |
| 3rd SAMPLE | | | ▨▨▨ | | | | | | ▨ | | | |
| 4th SAMPLE | | ▨▨▨▨▨▨ | | | | | | | ▨ | | | |
| 5th SAMPLE | | | | ▨▨▨ | | | | | ▨▨ | | | |
| 6th SAMPLE | | | | | ▨▨▨ | | | | ▨▨ | | | |
| 7th SAMPLE | ▨▨▨▨▨▨▨ | | | | | | | | | ▨ | | |
| 8th SAMPLE | | | ▨▨▨▨▨ | | | | | | ▨ | | | |

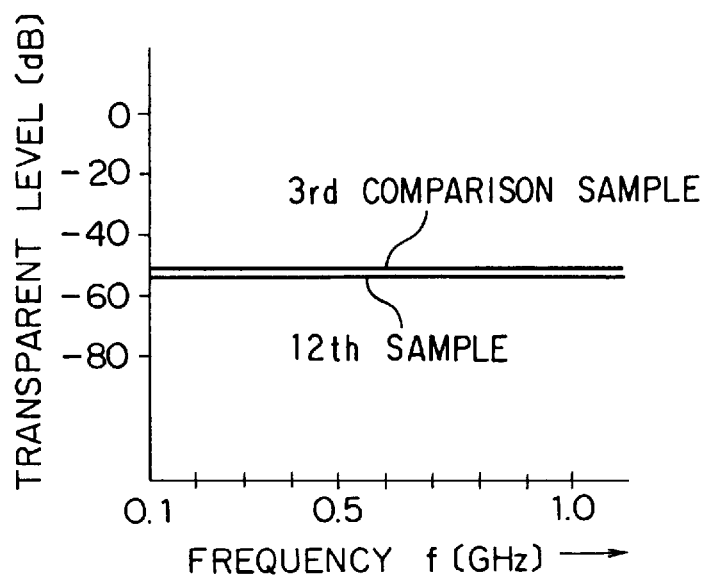
F I G. 22
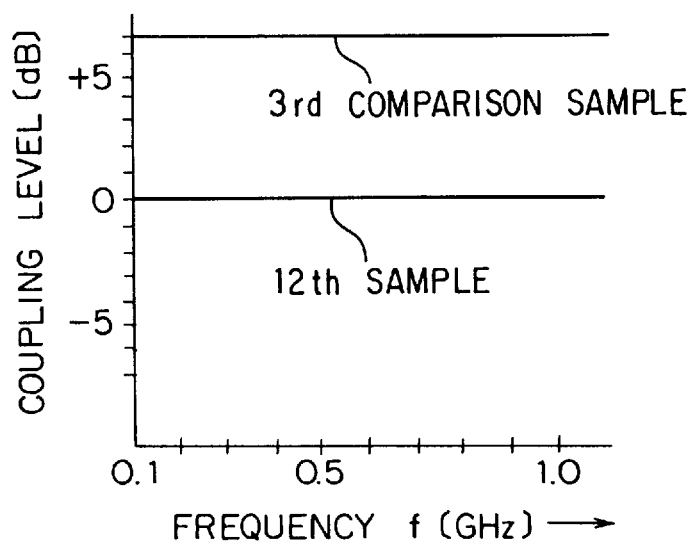
F I G. 23

ELECTRONIC DEVICE HAVING THE ELECTROMAGNETIC INTERFERENCE SUPPRESSING BODY

Background of the Invention

The present invention relates to an electromagnetic interference suppressing body for use in suppressing electromagnetic interference by any useless or undesired electromagnetic wave or waves, and also relates to an electric circuit device using the electromagnetic interference suppressing body.

In digital and/or high frequency electric circuit devices, small size and light weight are strongly desired and, therefore, electronic parts are required to be mounted on a printed circuit board as well as in an electric circuit device with a high density.

When electronic parts and wiring conductive lines are mounted on a circuit board, electromagnetic interference is caused by electrostatic and/or magnetic coupling between electronic parts and/or wiring conductive lines. Further, if a plurality of circuit boards are disposed adjacent to one another, electromagnetic interference is also caused between the adjacent circuit boards. In particular, the electromagnetic interference is severe when active elements such as semiconductor devices are mounted on the circuit board or boards because the active elements radiate undesired electromagnetic wave or inductive noise.

In the prior art, suppress of the electromagnetic interference was tried by means of connecting a low-pass filter or noise filter to each output terminal of the circuit board or by means of keeping a circuit in question at a distance. However, they require a space for disposing the filter or filters and/or a space for giving the distance. As a result, the device is made large in size and weight.

For suppressing electromagnetic coupling between adjacent circuit boards, a conductive shielding member was disposed between the circuit boards. However, the shielding member cannot prevent reflection of an undesired radiation from one circuit board, so that the reflection increases magnetic coupling between parts on the circuit board.

Hybrid integrated circuit elements are known as electronic circuit elements of a high density and a small size and are usually mounted on a mother board or boards in the electric circuit device. In the condition, the hybrid integrated circuit elements also suffer from electromagnetic interference.

SUMMARY OF THE INVENTION

Accordingly, it is an object of the present invention to provide an electromagnetic interference suppressing body with a low electromagnetic transparency and with a low electromagnetic reflection which enables to electromagnetically shield a circuit board from another circuit board adjacent thereto as well as to suppress reflection of undesired radiation by the body to thereby suppress coupling between parts on the same circuit board even without use of low-pass filter or noise filter and even without a large distance between parts or circuit boards.

It is another object of the present invention to provide an electric circuit device having an electromagnetic interference suppressing body with a low electromagnetic transparency and with a low electromagnetic reflection disposed in a space between an electronic circuit part and a circuit board to thereby suppress coupling between the circuit part and a wiring line on extending on the circuit board.

Further, it is an object of the present invention to provide a hybrid integrated circuit element wrapped by an electromagnetic interference suppressing body with a low electromagnetic transparency and with a low electromagnetic reflection which is enable to suppress electromagnetic interference caused by any external elements and by any internal elements.

According to the present invention, an electromagnetic interference suppressing body for suppressing electromagnetic interference by undesired electromagnetic waves can be obtained which comprises a conductive support element and a non-conductive soft magnetic layer overlying at least one of surfaces of the conductive support element.

Further, according to the present invention, an electronic equipment can be obtained which comprises a circuit board having an active element thereon, the active element generating an inductive noise, wherein an electromagnetic interference suppressing body is interposed between the circuit board and the active element, the electromagnetic interference suppressing body comprising a conductive support element and a non-conductive soft magnetic layer overlying at least one of surfaces of the conductive support element.

Furthermore, according to the present invention, a hybrid integrated circuit element can also be obtained which has a circuit board, an active element and a passive element mounted on the circuit board, and which is characterized in that the active element, the passive element, and the circuit board are covered together with and sealed by an insulating layer, a non-conductive soft magnetic layer comprising soft magnetic powder and organic binder, and overlying an outer surface of the insulating layer.

BRIEF DESCRIPTION OF THE DRAWINGS

FIG. 5 is a sectional view partly showing an electromagnetic interference suppressing body according to a sixth embodiment of the present invention;

FIG. 6 is a sectional view partly showing an electromagnetic interference suppressing body according to a seventh embodiment of the present invention;

FIG. 7 is a sectional view partly showing an electromagnetic interference suppressing body according to an eighth embodiment of the present invention;

FIG. 22 is a graph showing a frequency characteristic of transparent levels obtained by measuring a comparison sample and a sample of the present invention by use of the evaluating system shown in FIG. 9; and FIG. 23 is a graph showing a frequency characteristic of coupling levels obtained by measuring a comparison sample and a sample of the present invention by use of the evaluating system shown in FIG. 10.

Figure 1:
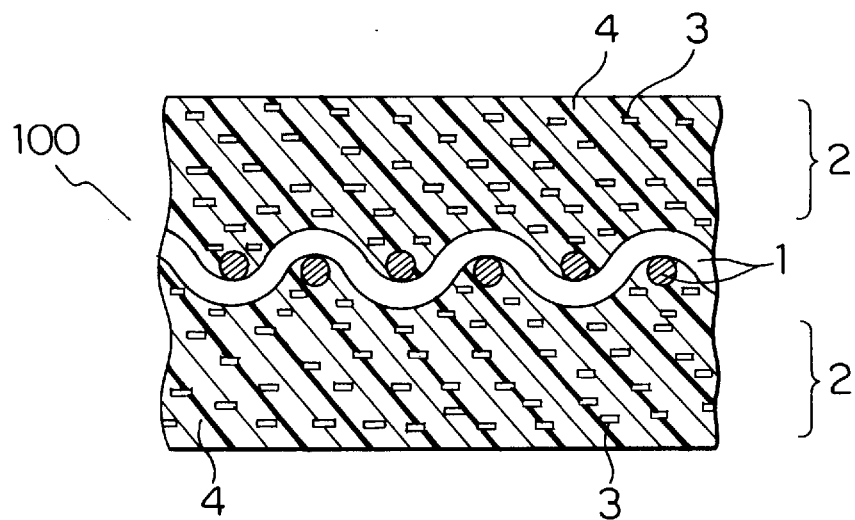
FIG. 1 is a sectional view partly showing an electromagnetic interference suppressing body according to a first embodiment of the present invention.

Description of the Preferred Embodiment:

Referring to FIG. 1, an electromagnetic interference suppressing body according to a first embodiment of the present invention is now described below. The electromagnetic interference suppressing body 100 shown therein comprises a conductive support element 1 and a non-conductive soft magnetic layer 2 mounted on or overlying at least one surface (two layers 2 are shown on both surfaces in FIG. 1). Non-conductive soft magnetic layer 2 comprises soft magnetic powder 3 of particles each of which has a flat shape or a needle-like shape, and organic binder 4 in which the soft magnetic powder 3 is uniformly dispersed.

For use as the conductive support element 1, one element is selected from, for example, a conductive plate, a conductive mesh plate, and a textile of conductive fiber. The conductive support element 1 can have the soft magnetic property. For use as the conductive support element 1 with the soft magnetic property, one element is also selected from, for example, a soft magnetic metal plate, a soft magnetic metal netting plate, and a textile of a soft magnetic metal fiber.

Figure 2:
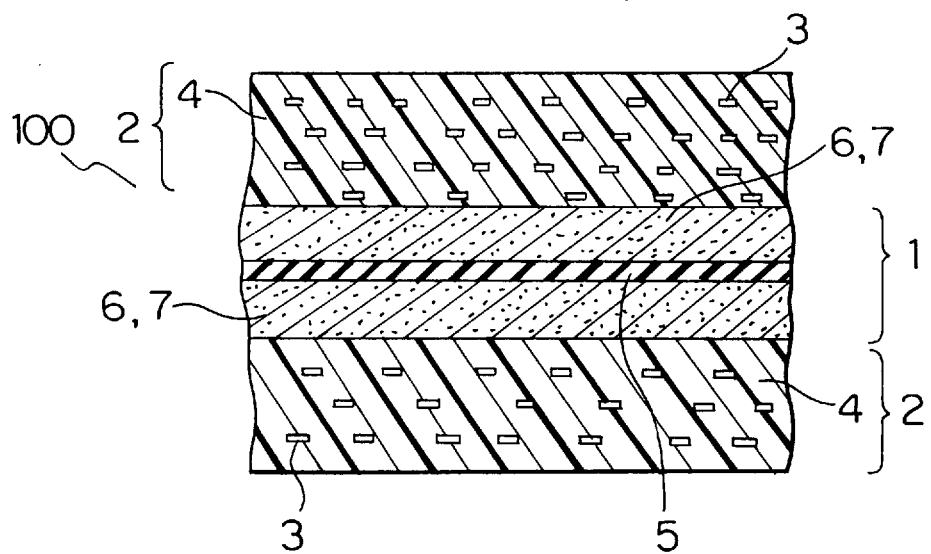
FIG. 2 is a sectional view partly showing, in a common structure, a conductive support element in an electromagnetic interference suppressing body according to a second and a third embodiments of the present invention.

In an electromagnetic interference suppressing body 100 according to a second embodiment of the present invention shown in FIG. 2, conductive support element 1 with or without the soft magnetic property comprises a non-conductive or insulative base member 5 and a conductive thin layer 6 formed by evaporation on at least one surface of non-conductive base member 5. Although two conductive thin layers 6 are shown on both surfaces in FIG. 2, one conductive thin layer 6 may be formed on one surface of non-conductive base member 5. Non-conductive soft magnetic layer 2 similar to the layer 2 shown in FIG. 1 is provided to overlie the conductive thin layer 6.

In an electromagnetic interference suppressing body 100 according to a third embodiment of this invention, a soft magnetic thin metal layer 7 can be used in place of the conductive layer 6 in FIG. 2. Although soft magnetic thin metal layer 7 is formed by evaporation on each of both surfaces of non-conductive base member 5, a single soft magnetic thin metal layer 7 may be formed on one surface thereof.

Figure 3:
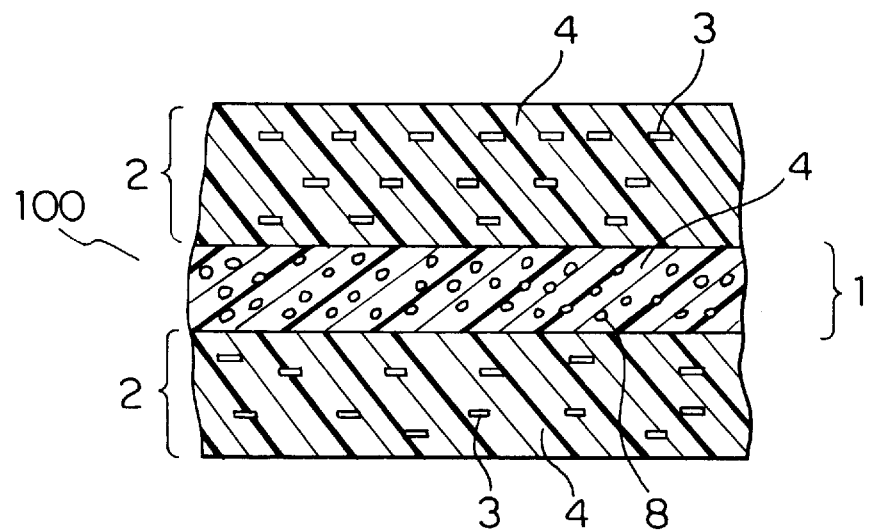
FIG. 3 is a sectional view partly showing a conductive support element in an electromagnetic interference suppressing body according to a fourth embodiment of the present invention.

In an electromagnetic interference suppressing body 100 according to a fourth embodiment of the present invention shown in FIG. 3, conductive support element 1 comprises organic binder 4 and conductive powder 8 dispersed therein. Non-conductive soft magnetic layer 2 similar to the layer 2 shown in FIG. 1 overlies at least one surface of conductive support body 1.

Figure 4:
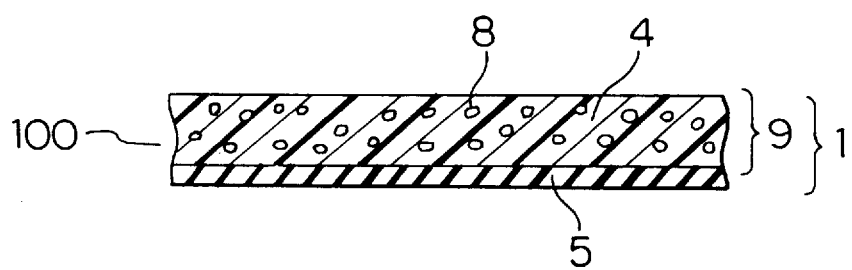
FIG. 4 is a sectional view partly showing a conductive support element in an electromagnetic interference suppressing body according to a fifth embodiment of the present invention.

In an electromagnetic interference suppressing body 100 according to a fifth embodiment of the present invention shown in FIG. 4, conductive support element 1 comprises non-conductive base member 5 and a conductive layer 9 overlying at least one surface of conductive layer 9. Non-conductive soft magnetic layer similar to the layer 2 shown in FIG. 1 is formed to overlie at least one surface of conductive support body 1.

Referring to FIG. 5, an electromagnetic interference suppressing body 100a sixth and seventh embodiment of the present invention comprises conductive support element 1, non-conductive soft magnetic layer 2 overlying at least one surface of conductive support body 1, and a dielectric layer 10 overlying a surface of non-conductive soft magnetic layer 2. Non-conductive soft magnetic layer 2 comprises soft magnetic powder 3 of particles, each of which has a flat shape or a needle-like shape, and organic binder 4. Dielectric layer 10 includes dielectric powder 11 and organic binder 4.

An electromagnetic interference suppressing body 100 shown as a seventh embodiment in FIG. 6 is similar to the sixth embodiment in FIG. 5, but is different in that the dielectric layer 10 is interposed between conductive support body 1 and non-conductive soft magnetic layer 2.

Referring to FIG. 7, an electromagnetic interference suppressing body 100 shown as an eighth embodiment comprises conductive support element 1 and non-conductive soft magnetic layer 2 overlying at least one surface of conductive support body 1. Non-conductive soft magnetic layer 2 comprises soft magnetic powder 3 of particles, each of which has a flat shape or a needle-like shape, dielectric powder 11, and organic binder 4.

In the embodiments mentioned above, the conductive support element 1 is selected from a conductive plate, a conductive mesh plate, and a textile of conductive fiber. Further, the conductive support element 1 may have the soft magnetic property and can be selected from a soft magnetic metal plate, a soft magnetic metal mesh plate, and a textile of a soft magnetic metal fiber.

Examples used for conductive support body 1 are as follows; a thin metal plate such as a thin copper plate, a thin stainless plate, and a thin aluminum plate, a, so called, punched metal made of such a thin metal plates through which holes are punched, a, so called, expanded metal plate made of those thin metal plates through which slits are formed and expanded thereafter, and a metal grid or netting by making fiber conductors into a grid or net.

The conductive support element can have the soft magnetic property and is made of such materials as a permalloy or iron-silicon steel and the like into the similar shapes as described above. By use of this conductive support element 1, it is expected to obtain high suppressing effect against the electromagnetic interference at relatively law frequency.

Typical materials of soft magnetic powder 3 are an iron-aluminum-silicon alloy which is referred to as "SENDUST" (trademark) having a high permeability at a high frequency range and an iron-nickel alloy (permalloy). Soft magnetic powder 3 is used in a state that it is reduced to fine powder and oxidized at its surface. Further, it is desirable that an aspect ratio of soft magnetic powder 3 is high enough, for example, about more than 5:1.

The conductive support element 1 is also made of a sheet which is formed by metal powder such as silver powder and copper powder, conductive carbon black, or conductive titanium oxide mixed with and dispersed in organic binder.

Furthermore, it is possible to use conductive support element which comprises non-conductive base member 5, for example, made of a polyimide base member and a conductive film of, for example, metal, magnetic metal, conductive carbon, organic conductive material and others which is formed by evaporation on at least one of the surfaces thereof.

The conductive support element 1 is also made of a sheet which is formed by coating a polyimide base member 5 with the mixture of the metal powder, conductive carbon black, or conductive titanium oxide and the organic binder 4, using a doctor blade method, a gravure coating method, a reverse coating method or the like.

As organic binder, the following materials are recommended; thermoplastic resins such as polyester resins, polyvinyl chloride resins, polyvinyl butyral resin, polyurethane resin, cellulose resins, nitrile-butadiene rubbers, styrene-butadiene rubbers and the like, copolymers of those thermoplastic resins or thermosetting resins such as epoxy resin, phenol resin, amide resins, imide resins and the like.

Non-conductive base member 5 is, for example, made of a polyimide base member on one side or both of which metal, magnetic metal, conductive carbon, organic conductive body or the like is deposited to form a thin layer using such deposition method as spattering, vacuum deposition, or chemical vapor deposition (CVD).

Further, it is desirable that dielectric layer 10 which is another element of the present invention described as the sixth embodiment or dielectric powder 11 used for non-conductive soft magnetic layer 2 has a high dielectric coefficient in a high frequency range and has a relatively flat frequency characteristic curve. For example, barium titanate series ceramics, titanium oxide-zirconium oxide series ceramics, lead perovskite series ceramics or the like is recommended.

The description will be made as to a test for evaluating properties of the electromagnetic interference suppressing body 100 according to the present invention.

Figure 8:
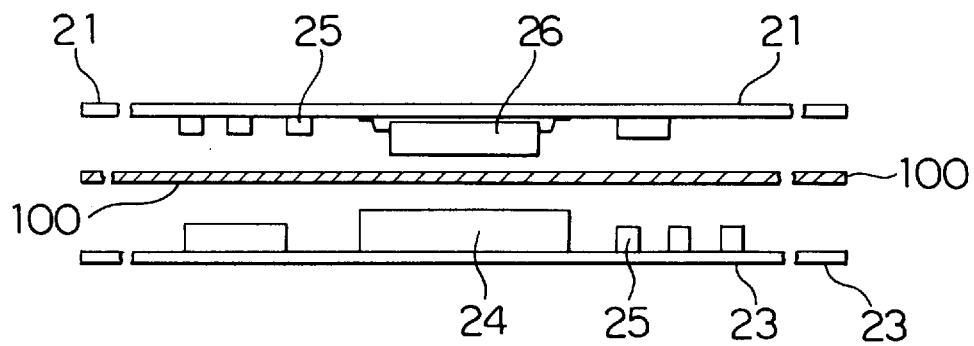
FIG. 8 is a sectional view schematically showing an example of application of an electromagnetic interference suppressing body according to the present invention which is interposed between circuit boards.

Referring to FIG. 8, an example of application of electromagnetic interference suppressing body 100 is supposed for the test. In the supposed application, two circuit boards 21 and 22 are disposed in parallel with each other and with a space left therebetween, and electromagnetic interference suppressing body 100 is disposed in the space with predetermined distances from respective circuit boards 21 and 22.

Two circuit boards 21 and 22 are individually provided with a plurality of electronic parts such as shown at 24, 25 and 26 mounted on mounting surfaces of those circuit boards and are disposed so that the mounting surfaces face each other. The distance between an electronic part 24, 25, or 26 on one circuit board and a facing one of electronic parts 24–26 on the other circuit board is about 2 mm but less than it.

Figures 9, 10:
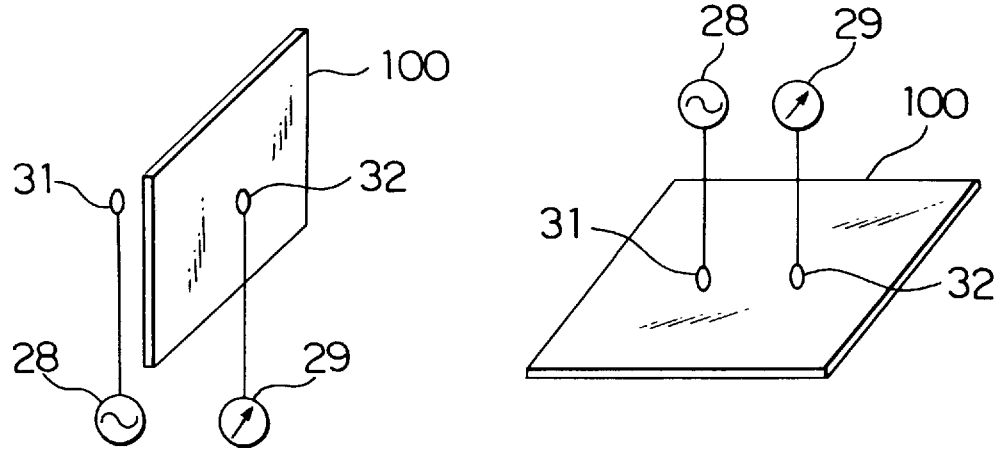
FIG. 9 is a schematic view of an evaluating system for use in evaluation of a characteristic of the electromagnetic interference suppressing body and especially for measuring an electromagnetic transparent level therethrough.
FIG. 10 is a schematic view of an evaluating system for use in evaluation of a characteristic of the electromagnetic interference suppressing body and especially for measuring an electromagnetic coupling level.

FIGS. 9 and 10 show different systems for evaluating properties of the electromagnetic interference suppressing body 100 of the present invention in the supposed application, as shown in FIG. 8. FIG. 9 shows an evaluating system for measuring the electromagnetic transparent level [dB] of the electromagnetic interference suppressing body 100, and FIG. 10 shows another evaluating system for measuring the electromagnetic coupling level [dB] 403 by the electromagnetic interference suppressing body 100. Each of the systems is provided with an electromagnetic wave generator 28 and an electromagnetic field measuring instrument (a receiving element) 29 which use a small loop antenna for radiating electromagnetic field having a loop diameter of less than 2mm and a small loop antenna for receiving electromagnetic field, respectively. A spectrum analyser (not shown) is used for measuring the values of the transparent and coupling levels.

The following is a detailed description of samples of electromagnetic interference suppressing body 100 of the present invention subjected to the evaluating test.

[First Sample]

A first sample having a structure of FIG. 1 was obtained by using a stainless wire netting of 24 mesh as the conductive support element 1, coating both side of the metal netting with a soft magnetic paste having a first composition described below by a doctor blade method to have a dried and cured total thickness of 1.2 mm, and performing curing for 24 hours at 85° C. The first sample thus obtained was analysed by use of a vibrating magnetometer and a scanning electron microscope, and it was confirmed that the directions of magnetization easy axis and magnetic particle alignment are in the surface of the sample.

<First Composition>
Flat soft magnetic powder—90 weight parts
  Composition: Fe-Al-Si alloy
  Average particle diameter: 10 $\mu$m
  Aspect ratio: >5
Organic Binder
  Polyurethane resin: 8 weight parts
  Hardening agent (Isocyanate compound) 2 weight parts
Solvent (Mixture of cyclohexane and toluene)- 40 weight parts

[Second Sample]

A second sample having a structure of FIG. 1 was obtained in the similar manner to obtain the first sample, except that a permalloy (52Ni-Fe) wire netting of 24 mesh having soft magnetic property was used as a conductive support body 1, instead of using a stainless wire netting in the first sample.

[Third Sample]

A third sample having a structure of FIG. 2 was obtained in the similar manner to obtain the first sample, except that the conductive support element 1 was used which comprised a polyimide film of 75 μm thickness and aluminum layers of 3 μm thickness formed on both surfaces of the film by sputtering.

[Fourth Sample]

A fourth sample having a structure of FIG. 2 was obtained in the similar manner to obtain the first sample, except that the conductive support element 1 was used which comprised a polyimide film of 75 μm thickness, and silver films formed by coating both surfaces of the polyimide film with a silver paste having a second composition described below by a doctor blade method to have a dried and cured thickness of 6 μm.

<Second composition>
Silver powder—95 weight parts
   Average particle diameter: 3 μm
Organic Binder
   Polyvinyl butyral resin: 4 weight parts
   Hardening agent (Isocyanate Compound)- 1 weight parts
Solvent (Ethyl cellosolve)—35 weight parts

[Fifth Sample]

A stainless wire netting of 24 mesh was used as a conductive support element 1. On both side of the stainless wire netting, a soft magnetic paste having a Third composition described below was coated by a doctor blade method so that the coating would have a total thickness of 1.0 mm after being dried and cured. Then, curing was carried out for 24 hours at 85° C. On the soft magnetic layer, a dielectric paste having a Fourth composition described below was coated by a doctor blade method to have a thickness of 100 μm after being dried and cured. A fifth sample having a structure of FIG. 5 was thus obtained.

The analysis of the fifth sample by use of the vibrating magnetometer and the scanning electron microscope revealed that the directions of magnetization easy axis and magnetic particle alignment were in the surface of the sample.

<Third Composition>
Flat soft magnetic powder—90 weight parts
   Composition: Fe-Al-Si alloy
   Average particle diameter: 10 μm
Organic Binder
   Polyurethane resin: 8 weight parts
   Hardening agent (Isocyanate compound)- 2 weight parts
Solvent (Mixture of cyclohexane and toluene)- 40 weight parts <Fourth Composition>
Barium titanate powder—90 weight parts
   Average particle diameter: 7 μm
Organic Binder
   Polyurethane resin: 8 weight parts
   Hardening agent (Isocyanate compound)—2 weight parts
Solvent (Mixture of cyclohexane and toluene)—45 weight parts

[Sixth Sample]

A sixth sample having a structure of FIG. 7 was obtained by using stainless wire netting of 24 mesh as a conductive support element 1, coating both side surfaces of the wire netting with a soft magnetic paste having a Fifth composition described below by a doctor blade method to have a total thickness of 1.2 mm after being dried and cured, and performing curing for 24 hours at 85° C.

<Fifth Composition>
Flat soft magnetic powder—70 weight parts
   Composition: Fe-Al-Si alloy
   Average particle diameter: 10 μm
   Aspect ratio: >5
Barium titanate powder—20 weight parts Average particle diameter: 7 μm
Organic Binder
   Polyurethane resin—8 weight parts
   Hardening agent (Isocyanate compound)— 2 weight parts
Solvent (Mixture of cyclohexane and toluene)—45 weight parts

[First Comparison Sample]

A copper plate having a thickness of 100 μm was used as a first comparison sample.

[Seventh Sample]

A seventh sample having a structure of FIG. 1 was obtained by using a copper plate of 35 μm thickness as a conductive support element 1, coating both side surfaces of the copper plate with a soft magnetic paste having the First composition by a doctor blade method to have a total thickness of 1 mm, and performing curing for 24 hours at 85° C. The analysis of the seventh sample by use of the vibrating magnetometer and the scanning electron microscope revealed that the directions of magnetization easy axis and the magnetic particle alignment were in the surface of the sample.

[Eight Sample]

An eighth sample having a structure of FIG. 1 was obtained in the similar manner to obtain the First sample, except that a stainless wire netting of 120 mesh was used as a conductive support element 1 instead of using the stainless wire netting of 24 mesh in the first sample.

[Second Comparison Sample]

A second comparison sample was obtained by mixing 80 weight parts of iron powder of ball like particles with an average particle diameter of 30 μm into 20 parts of nitrile rubber, and kneading and forming the mixture into a sheet having a thickness of 1.2 mm.

Figure 11:
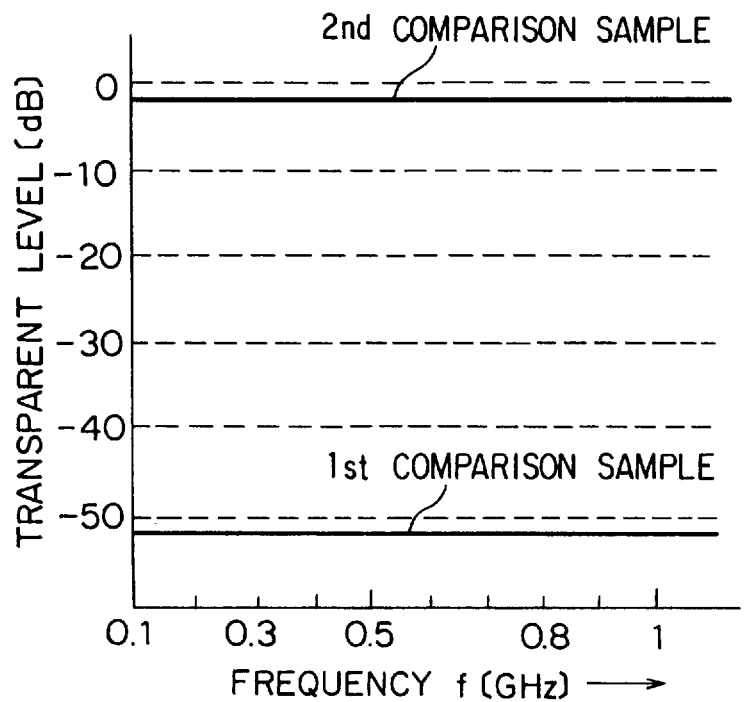
FIG. 11 is a graph showing a frequency characteristic of electromagnetic transparent levels obtained by measuring comparison samples by use of the evaluating system shown in FIG. 9.
Figure 12:
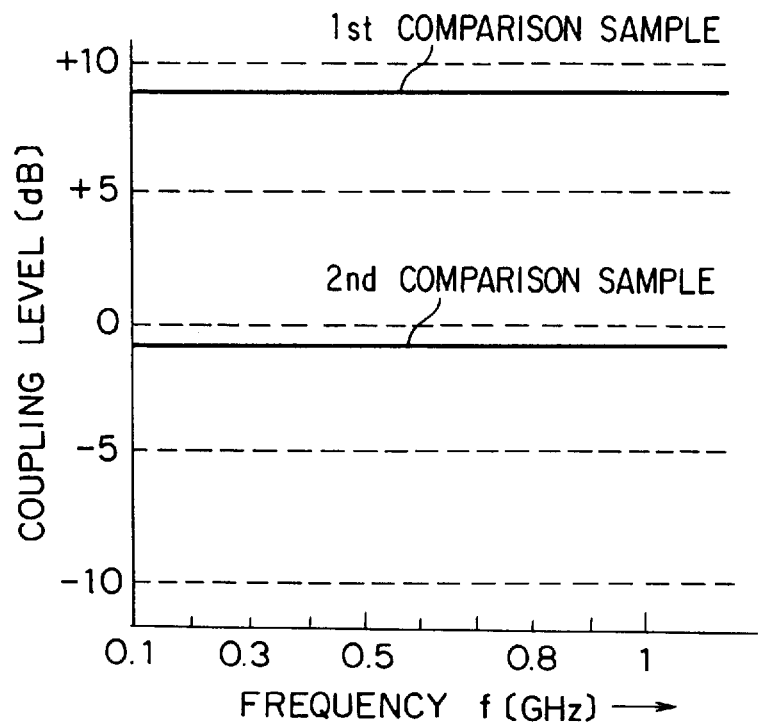
FIG. 12 is a graph showing a frequency characteristic of electromagnetic coupling levels obtained by measuring comparison samples by use of the evaluating system shown in FIG. 10.

The electromagnetic transparent levels and the electromagnetic coupling levels of the first to eighth samples and the first to second comparison samples were measured by use of the evaluating systems shown in FIGS. 9 and 10. The measured data are shown in FIGS. 11, 12, 13 and 14. FIG. 11 shows frequency characteristics of the electromagnetic transparent levels of the first and second comparison samples. Here, the standard of the transparent level is selected to be the strength of electromagnetic field measured at 29 in FIG. 9 when electromagnetic interference suppressing body 100 is not used in FIG. 9. FIG. 12 shows a frequency characteristics of the coupling levels of the first and second comparison samples. Here, the standard of the coupling level is selected to be the strength of electromagnetic field measured at 29 in FIG. 10 when electromagnetic interference suppressing body 100 is not used in FIG. 10.

Figure 13:
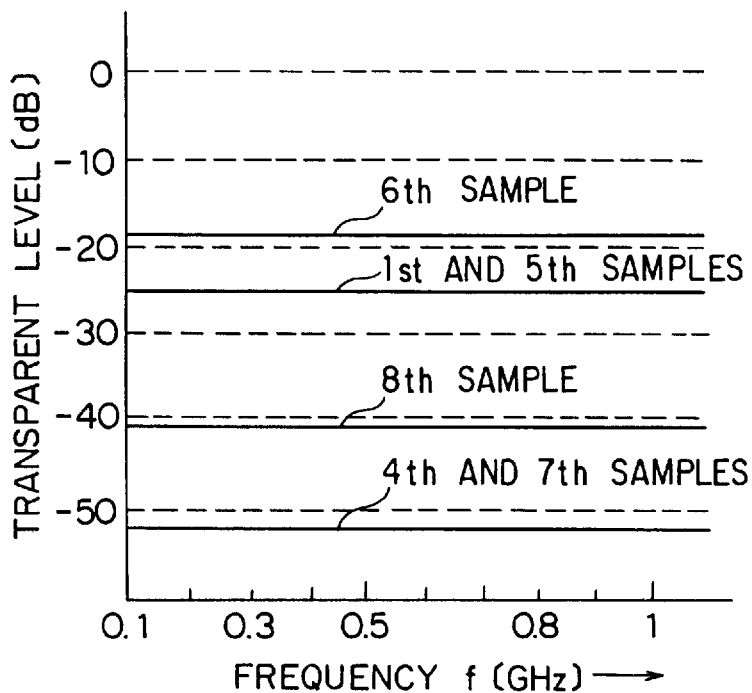
FIG. 13 is a graph showing a frequency characteristic of electromagnetic transparent levels obtained by measuring samples of the present invention by use of the evaluating system shown in FIG. 9.
Figure 14:
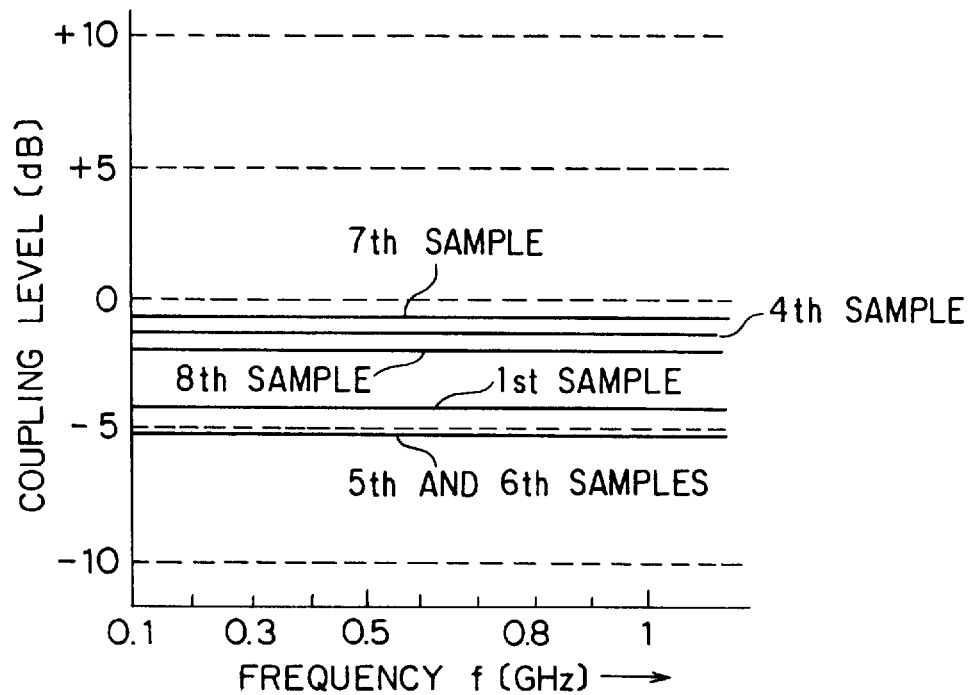
FIG. 14 is a graph showing a frequency characteristic of electromagnetic coupling levels obtained by measuring samples of the present invention by use of the evaluating system shown in FIG. 10.

FIG. 13 shows frequency characteristics of the electromagnetic transparent levels of the first to eighth samples. Here, the standard of the transparent level is selected to be the strength of electromagnetic field measured at 29 in FIG. 9 when the electromagnetic interference suppressing body 100 is not used in FIG. 9. FIG. 14 shows a frequency characteristics of the coupling levels of the first through eighth samples. Here, the standard of the coupling level is selected to be the strength of electromagnetic field measured at 29 in FIG. 10 when electromagnetic interference suppressing body 100 does not exist in FIG. 10.

Figures 15, 16:
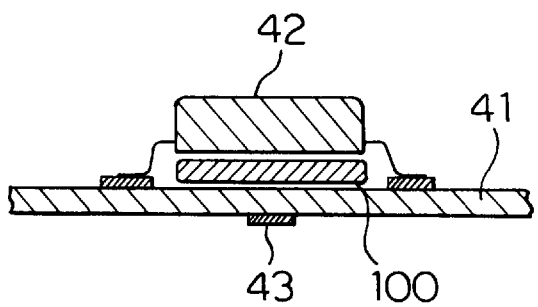
FIG. 15 is a graph for showing transparent levels and coupling levels of comparison samples and samples of the present invention at a frequency of 800 MHz.
FIG. 16 is a sectional view of an electronic equipment using the electromagnetic interference suppressing body.

FIG. 15 shows the transparent and the coupling levels of first to eighth samples and first to second comparison samples at a frequency of 800 MHz. As is seen from FIGS.

11, 12, and 15, the conductor (a copper plate) of the first comparison sample increases the coupling level, but lowers the transparent level. The second comparison sample does not almost attenuate the electromagnetic wave transparent therethrough, although it has a tendency to low the coupling level. That is, the second comparison sample is extremely low in the electromagnetic interference suppressing property.

On the contrary, the electromagnetic interference suppressing body 100 of the first to eighth samples according to the present invention are sufficiently low in the transparent level and in the coupling level as seen from FIGS. 13, 14, and 15. Accordingly, it can be seen in FIG. 8 that the two circuit boards 21 and 23, on which a plurality of electronic parts 24, 25 and 26 are mounted, are protected from electromagnetic interference from each other and in individual boards by the electromagnetic interference suppressing body 100 disposed in the space between two circuit boards 21 and 23.

It should be noted that the electromagnetic interference suppressing body 100 can suppress the electromagnetic interference in various high frequency electronic equipments including mobile communication equipments, since it ensures large attenuation for the electromagnetic radiation transparent therethrough without increasing the reflection of the undesired radiation.

Further, electromagnetic interference suppressing body 100 described in the embodiments can readily be make to have flexibility as seen from its construction so that it may comply with a complicated shape, anti-vibration or anti-shock requirements.

FIG. 16 shows an electronic equipment according to another embodiment which uses the electromagnetic interference suppressing body 100. The electronic equipment has an LSI 42 of an active element mounted on a circuit board 41 and a wiring conductor 43 printed on the other side of the board 41. The wiring conductor 43 extends below LSI 42. The electromagnetic interference suppressing body 100 having the same size and about half thickness as LSI 42 is mounted between LSI 42 and circuit board 41.

The electromagnetic interference suppressing body 100 is fixed to one of LSI 42 and the circuit board 41 before LSI 42 is mounted on the board 41. Electromagnetic interference suppressing body 100 effectively suppresses noises generated at wiring conductor 43 by reducing induction coupling between LSI 42 and circuit conductor 43, since the electromagnetic interference suppressing body 100 absorbs magnetic flux of a high frequency electromagnetic radiation generated by LSI 42.

Supposing the electronic equipment in FIG. 16, properties of the electromagnetic interference suppressing body 100 were evaluated by use of the systems shown in FIGS. 9 and 10.

Samples subjected to the evaluation test are ninth through eleventh samples described below.

[Ninth Sample]

The ninth sample has the same structure as shown in FIG. 1 and was obtained by using stainless wire netting of 120 mesh as a conductive support element 1, coating both sides of the netting with a soft magnetic paste having the first composition described above by a doctor blade method to have the total thickness of 0.5 mm after being dried and cured, and performing curing for 24 hours at 85° C. The ninth sample was analysed by use of the vibrating magnetometer and the scanning electron microscope. Thus, it was confirmed that the directions of the magnetization easy axis and the magnetic particle alignment were in the surface of the sample.

[Tenth Sample]

The tenth sample having a structure of FIG. 2 was obtained in the similar manner to obtain the ninth sample, except that a polyimide film of 75 μm thickness having 3 um thick aluminum layers formed on both surfaces thereof by sputtering was used as the conductive support element 1.

[Eleventh Sample]

The eleventh sample having a structure of FIG. 2 was obtained in the similar manner to obtain the ninth sample, except that the conductive support element 1 was a 75 μm thick polyimide film, on both surfaces of which a silver paste having the second composition described above was coated by a doctor blade method to have 6μm thickness after being dried and cured.

The first and second comparison samples were also evaluated.

Figure 17:
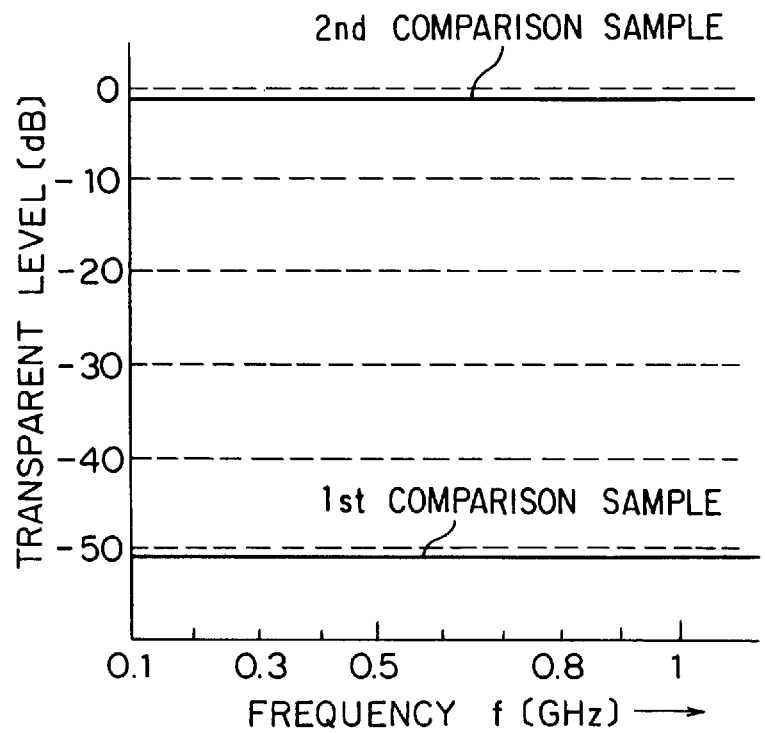
FIG. 17 is a graph showing a frequency characteristic of transparent levels obtained by measuring comparison samples by use of the evaluating system shown in FIG. 9.
Figure 18:
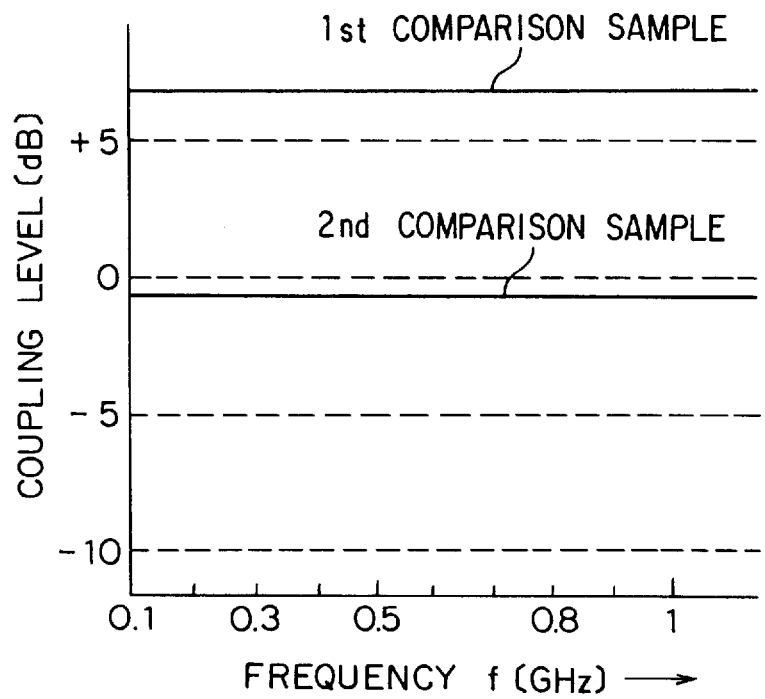
FIG. 18 is a graph showing a frequency characteristic of coupling levels obtained by measuring comparison samples by use of with the evaluating system shown in FIG. 10.

The electromagnetic transparent levels and the electromagnetic coupling levels of the ninth to eleventh samples and the first to second comparison samples were measured by use of the evaluating systems shown in FIGS. 9 and 10. The measured data are shown in FIGS. 17–20. FIG. 17 shows frequency characteristics of the electromagnetic transparent levels of the first and second comparison samples. Here, the standard of the transparent level is selected to be the strength of electromagnetic field measured at 29 in FIG. 9 when electromagnetic interference suppressing body 100 is not used in FIG. 9. FIG. 18 shows a frequency characteristics of the coupling levels of the first and second comparison samples. Here, the standard of the coupling level is selected to be the strength of electromagnetic field measured at 29 in FIG. 10 when electromagnetic interference suppressing body 100 is not used in FIG. 10.

Figure 19:
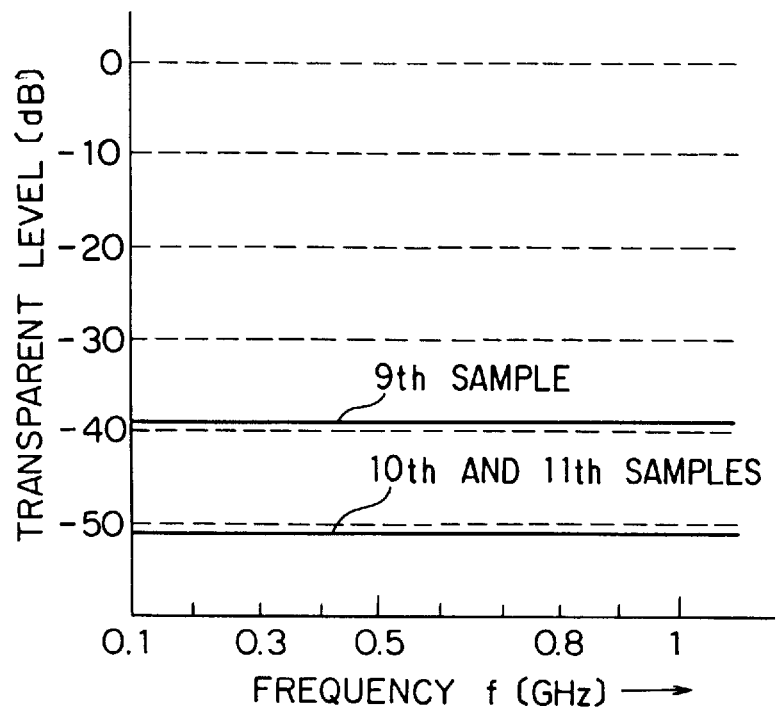
FIG. 19 is a graph showing a frequency characteristic of transparent levels obtained by measuring samples of the present invention by use of the evaluating system shown in FIG. 9.
Figure 20:
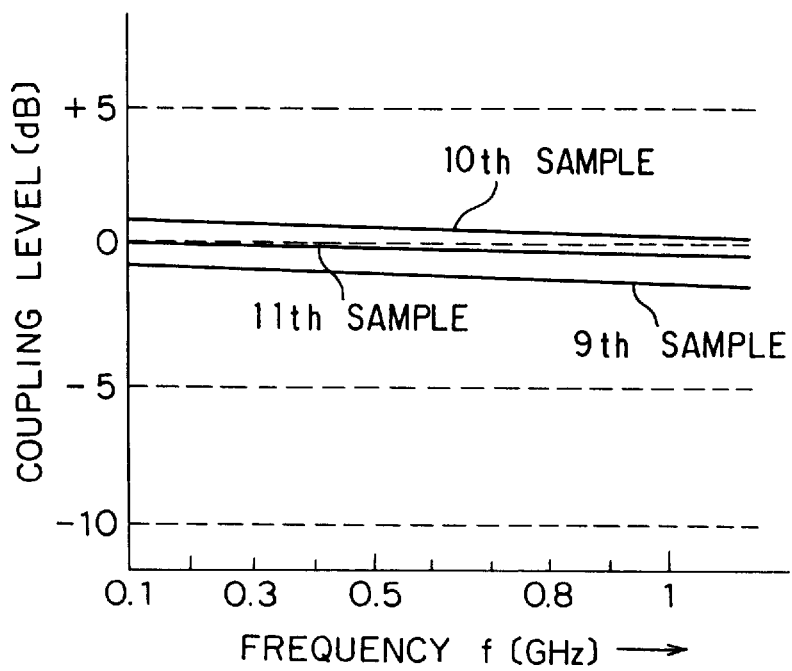
FIG. 20 is a graph showing a frequency characteristic of coupling levels obtained by measuring samples of the present invention by use of the evaluating system shown in FIG. 10.

FIG. 19 shows frequency characteristics of the electromagnetic transparent levels of the ninth to eleventh samples. Here, the standard of the transparent level is selected to be the strength of electromagnetic field measured at 29 in FIG. 9 when the electromagnetic interference suppressing body 100 is not used in FIG. 9. FIG. 20 shows a frequency characteristics of the coupling levels of the ninth through eleventh samples. Here, the standard of the coupling level is selected to be the strength of electromagnetic field measured at 29 in FIG. 10 when electromagnetic interference suppressing body 100 does not exist in FIG. 10.

As is seen from FIGS. 17 and 18, the conductor (a copper plate) of the first comparison sample increases the coupling level to a value of +7 dB, but lowers the transparent level of −50 dB. The second comparison sample has the transparent level of about −1 dB and does not almost attenuate the electromagnetic wave transparent therethrough, although it has a tendency to low the coupling level of 0 dB.

On the contrary, the ninth to eleventh samples of the electromagnetic interference suppressing body 100 according to the present invention are sufficiently low in the transparent level of about −39 dB and in the coupling level of +1 dB, as seen from FIGS. 19 and 20.

It should be noted that the electromagnetic interference suppressing body 100 can suppress the electromagnetic interference without affection by the reflection of undesired radiation in various electronic equipments in which electronic parts are mounted on a printed circuit board as shown in FIG. 16. Further, since the electromagnetic interference suppressing body 100 is produced with a thin type plate, electronic equipments can be made smaller in size, lighter in weight, and low in cost although it has the suppressing properties against the electromagnetic interference.

Figure 21:
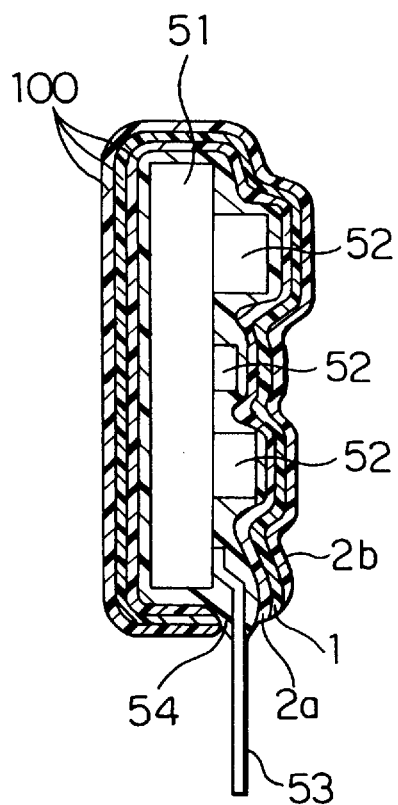
FIG. 21 is a sectional view of a hybrid integrated circuit using the electromagnetic interference suppressing body.

FIG. 21 shows an embodiment of a hybrid integrated circuit element using electromagnetic interference suppressing body 100. The hybrid integrated circuit element comprises a circuit board 51, parts 52 such as an active element, passive element or the like mounted on circuit board 51, and connection lead wires 53 for connecting those parts 52 to external equipments. An outer surface of the hybrid integrated circuit element is covered with a dielectric coating layer 54 such as resin or the like. In the hybrid integrated circuit element, the outer surface of dielectric coating layer 54 is covered with an electromagnetic interference suppressing body 100 shown in FIG. 3 without contacting with lead wire 53. The electromagnetic interference suppressing body 100 comprises a conductive support element 1 which is coated with a first non-conductive soft magnetic layer 2a and a second non-conductive soft magnetic layer 2b on both sides thereof, respectively.

The first dielectric soft magnetic layer 2a, the conductive support element 1 and the second non-conductive soft magnetic layer 2b are formed by a, so called, slurry impregnating method in which the hybrid integrated circuit element is dipped into a soft magnetic slurry and a conductive slurry, alternatingly. The soft magnetic slurry and the conductive slurry are made by mixing a soft magnetic powder 3 and a conductive powder 8 with organic binder to form mixtures and by kneading the mixtures to disperse the powder into the binder, respectively. Here, as the soft magnetic powder 3 included in the first and second non-conductive soft magnetic layers 2a and 2b, iron-aluminum-silicon alloy which is known as "Sendust" (trademark), and iron-nickel alloy (permalloy) can be used. Further, the soft magnetic body powder 3 is used after being ground into fine powder and surface-oxidized. It is desirable that the aspect ratio of these powders is sufficiently large (about more than 5:1). Further, as the conductive powder 8 included in the conductive support element 1, metal fine powder such as copper powder and silver powder, conductive carbon black powder or conductive titanium oxide powder can be used.

Furthermore, the thickness of the non-conductive soft magnetic layers 2a and 2b and the conductive support element 1 and constituent materials are determined to realize an optimum electromagnetic condition taking circuit conditions of the hybrid integrated circuit element, an arrangement of electronic parts to be mounted and the intensity of the undesired electromagnetic field and the like into consideration.

Supposing the hybrid integrated circuit element in FIG. 21, properties of the electromagnetic interference suppressing body 100 were evaluated by use of the systems shown in FIGS. 9 and 10. The following twelfth sample and third comparison sample were subjected to the evaluating test.

[Twelfth Sample]

The first and the second non-conductive soft magnetic layers 2a and 2b having a sixth composition as described below were formed on both side surfaces of the conductive support element 1 having a seventh composition described below by the slurry dipping method to produce the twelfth smaple having a structure of FIG. 3.

<Sixth Composition>

Flat soft magnetic powder—90 weight parts
   Composition: Fe-Al-Si alloy
   Average particle diameter: 10 $\mu$m
   Aspect ratio: >5
Organic Binder
   Polyurethane resin: 8 weight parts
   Hardening agent (Isocyanate compound)—2 weight parts
Solvent (Mixture of cyclohexane and toluene)—40 weight parts
Ethyl cellosolve—45 weight parts <Seventh composition>

Silver powder—95 weight parts
   Average particle diameter: 3 $\mu$m
Organic Binder
   Polyvinyl butyral resin—4 weight parts
   Hardening agent (Isocyanate compound)—1 weight parts
Solvent (Ethyl cellosolve)—75 weight parts

[Third Comparison Sample]

A third comparison sample was obtained with 100 $\mu$m thickness by coating both sides of a polyimide film of 75 $\mu$m thickness with silver paste having the seventh composition, using the slurry dipping method and by drying and hardening the paste.

FIGS. 22 and 23 show the results of the electromagnetic transparent level and the electromagnetic coupling level as measured.

It is clear from FIGS. 22 and 23 that the third comparison sample is sufficient low in the transparent level, but is high in the coupling level. In twelfth sample, on the contrary, the transparent level is sufficiently low and the coupling level is not increased but low. This means that the hybrid integrated circuit element according to the embodiment has a sufficient shielding effect against electromagnetic waves as the conventional element coated with the silver paste and does not have any reflection of electromagnetic waves which has been seen in the conventional element.

Now, description will be made as to a test for evaluating the electromagnetic suppressing properties of the hybrid integrated circuit element in an actual use. For the test, an outer surface of the hybrid integrated circuit element sealed by resin was coated with a first non-conductive soft magnetic layer 2a, a conductive support body 1 and a second non-conductive soft magnetic layer 2b laminated one on another in this order using the slurry dipping method. After these layers were cured or hardened, the thickness of these three layers were measured to be 0.7 mm. These first and second non-conductive soft magnetic layers 2a and 2b were analyzed with the vibrating magnetometer and the scanning electron microscope. Both directions of the magnetization easy axis and the magnetic particle alignment are in the surface of the sample.

Furthermore, the hybrid integrated circuit element was mounted on the mother board and the operation of electric circuit was observed. No adverse effect was confirmed.

As described above, the hybrid integrated circuit element coated with the dielectric soft magnetic layers and the conductive support element is neither affected by any undesired radiation nor enhance the electromagnetic coupling by reflection when the element is mounted on the mother board.

According to the present invention in which the outer surface of the hybrid integrated circuit element sealed by resin is provided with first non-conductive soft magnetic layer, a hybrid integrated circuit element is obtained having a sufficient shielding effect against radiant electromagnetic waves from the mother board or other parts mounted on the mother board without enhancing the electromagnetic coupling between the inner parts or between the parts mounted on the mother board and without impeding its own operation. In particular, it is considerably advantageous to combine non-conductive soft magnetic layers 2a, 2b and conductive support element 1.

Although the present invention is described with reference to several embodiments, it is needless to say that the present invention is not limited to the above embodiments and various variations are possible without departing from the spirit of the invention.

What is claimed is:

1. A hybrid integrated circuit element having a circuit board, an active element and a passive element mounted on the circuit board, which is characterized in that said active element, said passive element, and said circuit board are covered together with and sealed by an insulating layer, a non-conductive soft magnetic layer comprising soft magnetic powder and organic binder, and overlying an outer surface of said insulating layer.

2. A hybrid integrated circuit element claimed in claim 1, wherein said non-conductive soft magnetic layer comprises a first and a second non-conductive soft magnetic layer portions and a conductive layer interposed therebetween, said conductive layer comprising conductive powder and organic binder.

3. A hybrid integrated circuit element claimed in claim 1, wherein said soft magnetic powder comprises soft magnetic particles each having a flat or needle-like shape, said powder being dispersed in said organic binder.

* * * * *

UNITED STATES PATENT AND TRADEMARK OFFICE
CERTIFICATE OF CORRECTION

PATENT NO. : 5,864,088
DATED : January 26, 1999
INVENTOR(S) : Mitsuhara Sato et al.

It is certified that error appears in the above-indentified patent and that said Letters Patent is hereby corrected as shown below:

Title page, item [75], insert the following:

Yukio Hotta of Miyagi as a co-inventor

Item [30], the following priority document should be added:

--January 20, 1994 [JP] .....4864--

Signed and Sealed this

Ninth Day of January, 2001

Attest:

Q. TODD DICKINSON

*Attesting Officer*      *Commissioner of Patents and Trademarks*